US012781345B2

(12) United States Patent
Ishikawa

(10) Patent No.: US 12,781,345 B2
(45) Date of Patent: Nov. 3, 2026

(54) METAL CHLORIDE GAS GENERATION METHOD AND APPARATUS

(71) Applicant: Sandisk Technologies, Inc., Milpitas, CA (US)

(72) Inventor: Hiraku Ishikawa, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/893,461

(22) Filed: Sep. 23, 2024

(65) Prior Publication Data

US 2026/0085418 A1 Mar. 26, 2026

(51) Int. Cl.

| | |
|---|---|
| ***C23C 16/455*** | (2006.01) |
| ***C01F 7/56*** | (2022.01) |
| ***C23C 14/34*** | (2006.01) |
| ***C23C 16/40*** | (2006.01) |
| *H10P 14/60* | (2026.01) |

(52) U.S. Cl.

CPC .......... *C23C 16/45553* (2013.01); *C01F 7/56* (2013.01); *C23C 14/34* (2013.01); *C23C 16/403* (2013.01); *H10P 14/6339* (2026.01)

(58) Field of Classification Search

CPC ........ C23C 16/45525; C23C 16/45553; C23C 16/448; C23C 16/45536; C23C 16/4554; C23C 16/45542; C23C 16/45544; H01J 37/32449; H01J 37/32596; C30B 25/02

See application file for complete search history.

(56) References Cited

U.S. PATENT DOCUMENTS

| | | | | |
|---|---|---|---|---|
| 2013/0087093 | A1* | 4/2013 | Olgado | C30B 29/406 117/103 |
| 2014/0251954 | A1* | 9/2014 | Winkler | H01J 37/32449 134/1.1 |
| 2022/0310385 | A1 | 9/2022 | Tapily | |
| 2023/0139917 | A1* | 5/2023 | Tois | C23C 16/45523 427/252 |
| 2023/0402262 | A1* | 12/2023 | Cho | H01J 37/32568 |

FOREIGN PATENT DOCUMENTS

| | | | |
|---|---|---|---|
| CN | 113463063 | * | 10/2021 |
| CN | 113463063 | A | 10/2021 |
| DE | 10118130 | * | 10/2002 |
| JP | H07161687 | A | 6/1995 |
| JP | 2007009282 | A | 1/2007 |
| JP | 2007231359 | A | 9/2007 |

OTHER PUBLICATIONS

ISR-WO—Notification of Transmittal of the International Search Report and Written Opinion of the International Searching Authority for International Patent Application No. PCT/US2025/026693, mailed Aug. 25, 2025, 12 pages.

(Continued)

*Primary Examiner* — Tabassom Tadayyon Eslami

(74) *Attorney, Agent, or Firm* — THE MARBURY LAW GROUP PLLC

(57) ABSTRACT

A metal chloride gas generation method includes generating a plasma of a chlorine-containing source gas, and reacting chlorine ions or radicals from the plasma with a solid target metal source to generate the metal chloride gas.

19 Claims, 7 Drawing Sheets

(56) References Cited

OTHER PUBLICATIONS

MKS, Application, “Controlling Vapor Condensation and Downstream Deposits in Deposition and Etch Tools,” https://www.mks.com/mam/celum/celum_assets/resources/VaporCondensationDownstreamDeposits-AppNote.pdf viewed on Sep. 23, 2024.
Musgrave, C. et al., “Precursors for Atomic Layer Deposition of High-k Dielectrics,” Process Gases, Chemicals and Materials, Section 7, Viewed on Sep. 23, 2024 https://hwpi.harvard.edu/files/gordon/files/precursors_for_ald.pdf.
Xia, X. et al. “Use of a New Non-Pyrophoric Liquid Aluminum Precursor for Atomic Layer Deposition,” Materials 2019, vol. 12, pp. 1429; DOI:10.3390/ma12091429.

* cited by examiner

METAL CHLORIDE GAS GENERATION METHOD AND APPARATUS

FIELD

The present disclosure relates generally to a semiconductor processing method and apparatus, and more particularly to an apparatus including an in-situ metal chloride gas generator and methods for operating the same.

BACKGROUND

Various semiconductor fabrication processes, such as deposition and etching processes, use metal chloride source gases. For example, atomic layer deposition (ALD) of a metal oxide layer may use alternating metal deposition and oxidation steps using alternating metal chloride source gas pulse step and an oxidant pulse step to form a metal oxide layer on a substrate located in an ALD apparatus.

SUMMARY

According to an aspect of the present disclosure, a metal chloride gas generation method includes generating a plasma of a chlorine-containing source gas, and reacting chlorine ions or radicals from the plasma with a solid target metal source to generate the metal chloride gas.

According to another aspect of the present disclosure, a method includes generating a metal chloride gas in a metal chloride gas generator; providing the metal chloride gas from the metal chloride gas generator to a buffer tank through a first gas flow conduit; storing the metal chloride gas in the buffer tank; and providing the metal chloride gas from the buffer tank to a process unit through a second gas flow conduit to etch a material located on a substrate in the process unit or to deposit a material layer on a substrate located in the process unit.

According to another aspect of the present disclosure, an apparatus includes a metal chloride gas generator configured to generate a process source gas comprising a metal chloride gas, wherein the metal chloride gas generator comprises a plasma generator configured to generate a plasma of a chlorine-containing source gas, and a solid target metal source that is exposed to or is located downstream of the plasma generator; a process unit comprising a vacuum enclosure configured to hold a substrate therein and to receive the process source gas; and a buffer tank located between the metal chloride gas generator and the process unit, and configured to receive the process gas from the metal chloride gas generator and to provide the process source gas to the process unit.

DETAILED DESCRIPTION

Figure 1:
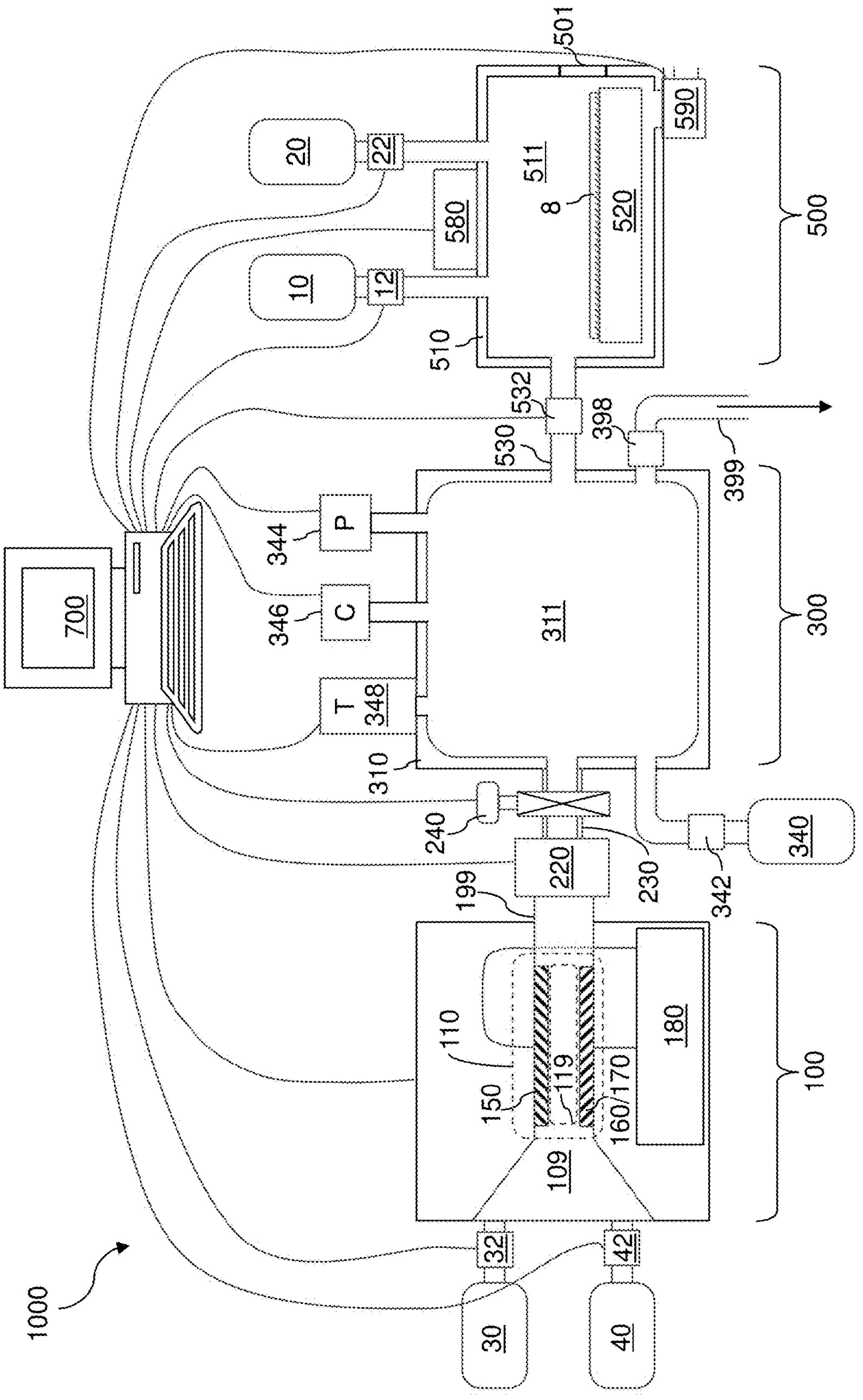
FIG. 1 is a schematic view of an apparatus including an in-situ metal chloride gas generator according to an embodiment of the present disclosure.

As discussed above, embodiments of the present disclosure are directed to an apparatus including an in-situ metal chloride gas generator and methods for operating the same, the various aspects of which are now described in detail.

The drawings are not drawn to scale. Multiple instances of an element may be duplicated where a single instance of the element is illustrated, unless the absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

The present inventor realized that the generation rate of metal chloride gases, such as aluminum chloride ($AlCl_3$), through the sublimation of a solid metal chloride source depends on the physically exposed surface area of the solid metal chloride source. After a period of time of using the solid metal oxide source to general the metal chloride gas (e.g., vapor), the solid metal chloride source is consumed and its surface area is reduced, which leads to a reduced amount of the supplied metal chloride gas. This decrease in the metal chloride gas supply rate over time negatively affects the semiconductor fabrication process, such as an etching process or a deposition process (e.g., ALD process), which uses the metal chloride gas.

Embodiments of the present disclosure provide an apparatus including an in-situ metal chloride gas generator in which the metal chloride supply rate does not significantly decrease over time.

An exemplary embodiment of the apparatus 1000 including an in-situ metal chloride gas generator 100 is illustrated in FIG. 1. The apparatus 1000 includes an in-situ metal chloride gas generator 100, a buffer tank 300, a process unit 500, and a process controller 700.

The in-situ metal chloride gas generator 100 is configured to receive a chlorine-containing source gas, which may be a mixture of a chlorine ($Cl_2$) gas and an inert carrier gas, such as argon or nitrogen. The inert gas within the chlorine-containing source gas functions as a carrier gas for the chlorine gas. For example, a chlorine gas mass flow controller 32 can be connected to a chlorine gas supply 30, and can be configured to control the flow rate of a chlorine gas from the chlorine gas supply (e.g., a chlorine gas storage vessel, such as a gas tank) 30 into a gas inlet of the in-situ metal chloride gas generator 100. An inert gas mass flow controller 42 can be connected to an inert gas supply (e.g., an argon or nitrogen gas storage vessel, such as a gas tank) 40, and can be configured to control the flow rate of an inert gas from the inert gas supply 40 into the gas inlet of the in-situ metal chloride gas generator 100. The chlorine-containing source gas can be formed inside the in-situ metal chloride gas generator 100 upon mixture of the chlorine gas and the inert carrier gas. Alternatively, the chlorine-containing source gas may be pre-mixed (i.e., a mixture of chlorine and carrier gases), and can be supplied to a common inlet port of the in-situ metal chloride gas generator 100.

The in-situ metal chloride gas generator 100 includes a target metal source 170 that functions as a source of metal atoms within a metal chloride gas that is generated from the in-situ metal chloride gas generator 100. Generally, the in-situ metal chloride gas generator 100 may comprise a solid phase metal plate or tube that consists essentially of the metal that is contained within the metal chloride gas to be generated. Examples of metals that can be used in this process include aluminum, tantalum, titanium, copper, vanadium, etc. Generally, any metal capable of forming metal chloride gas (e.g., vapor) by sublimation may be employed. Nonlimiting examples of metal chloride gases include $AlCl_3$, $TaCl_5$, $TiCl_4$, $CuCl_2$, and $VCl_4$, etc. The versatility of this plasma-assisted generation process allows for the efficient production of a wide range of metal chloride gases, suitable for various industrial applications, such as semiconductor device processing. In one embodiment, the target metal source 170 consists essentially of solid aluminum metal, and the metal chloride gas comprises aluminum chloride (which is also known as aluminum trichloride, $AlCl_3$).

The in-situ metal chloride gas generator 100 comprises a plasma generator, such as a plasma chamber 110 containing an anode 150 and a cathode 160 that are configured to generate a plasma 119 of the chlorine-containing source gas. Thus, the chlorine gas and the inert gas flow through a cavity 109 including a plasma zone in which a plasma 119 of the chlorine-containing source gas is generated. The anode 150 and the cathode 160 of the in-situ metal chloride gas generator 100 may be configured in various configurations, as will be described in subsequent sections.

In one embodiment, the in-situ metal chloride gas generator 100 may include a radio-frequency power supply 180 configured to generate the plasma 119 of the chlorine-containing source gas. The target metal source 170 is exposed to, or is located downstream of, the plasma 119. The in-situ metal chloride gas generator 100 may induce a chemical reaction between chlorine ions and/or radicals within the plasma 119 and a surface portion of the target metal source 170 to produce molecules of the metal chloride gas. In other words, reaction of the chlorine ions and/or radicals with the metal surface of the target metal source 170 can generate the molecules of the metal chloride gas. According to an aspect of the present disclosure, the target metal source 170 can be configured as a solid phase material plate or tube having a uniform thickness throughout. The uniform thickness of the target metal source 170 provided by its plate or tube configuration provides a constant surface area for reaction with the chlorine radicals in the plasma 119, thereby preventing a decrease of the metal chloride gas supply over time.

In some embodiments, a direct plasma is employed to induce reaction between the chlorine ions and/or radicals and the metal of the target metal source 170. In this case, the target metal source 170 comprises the cathode 160 that is electrically connected to the radio-frequency power supply 180, and the in-situ metal chloride gas generator 100 is configured to generate ions and/or radicals of the chlorine-containing source gas upon reaction of the plasma 119 with a surface portion of the target metal source 170. Alternately, a remote plasma is used to induce reaction between the chlorine ions and/or radicals and the material of the target metal source 170. In this case, the target metal source 170 is different from the electrodes (150, 160) of the plasma generation system (150, 160, 180), and the in-situ metal chloride gas generator 100 is configured to generate ions and/or radicals of the chlorine-containing source gas upon reaction of the plasma 119 with a surface portion of the target metal source 170 that is located downstream of the plasma 119.

The in-situ metal chloride gas generator 100 comprises a gas generator outlet 199 which is configured to collect the generated metal chloride gas. In one embodiment, the apparatus 1000 includes a vacuum pump 220 to provide vacuum suction to the molecules of the metal chloride gas that are generated in the in-situ metal chloride gas generator 100. In one embodiment, the vacuum pump 220 may have a pumping port that is connected to the gas generator outlet 199 and is configured to provide a vacuum suction to the gas generator outlet 199. The vacuum pump 220 may have an exhaust port that is connected to an inlet port of the buffer tank 300 via a first gas flow conduit (e.g., manifold or pipe) 230.

In one embodiment, the gas flow manifold 230 comprises a shutoff valve 240. In one embodiment, the process controller 700 is configured to open the shutoff valve 240 while the in-situ metal chloride gas generator 100 supplies the molecules of the metal chloride gas to the buffer tank 300, and to close the shutoff valve 240 while the in-situ metal chloride gas generator 100 does not supply the molecules of the metal chloride gas to the buffer tank 300.

The buffer tank 300 is configured to receive a gas mixture including the metal chloride gas from the in-situ metal chloride gas generator 100, and to store the gas mixture for use during a process step (e.g., layer deposition or layer etching) that is performed in the process unit 500. The gas mixture may comprise the metal chloride gas, the inert gas and any remaining chlorine gas. The buffer tank 300 comprises a tank enclosure 310 that encapsulates an enclosed volume, which is herein referred to as a gas storage volume 311. The buffer tank 300 stabilizes the supply of metal chloride gas by maintaining desired storage conditions for the stored gas therein, i.e., the metal chloride gas that is generated in the in-situ metal chloride gas generator 100. The buffer tank 300 reduces fluctuations in concentration, temperature, and pressure of the metal chloride gas, which can negatively affect the process uniformity of a process that is performed in the process unit 500. In other words, the buffer tank 300 regulates and stabilizes the pressure, the temperature, and the concentration of a process source gas that is subsequently supplied to the process unit 500 so that the concentration of the metal chloride gas within the process source gas, the supply pressure for the process source gas, and the temperature of the process source gas are stable.

Specifically, the buffer tank 300 maintains the gas mixture at a temperature and pressure at which the metal chloride remains in the gas (e.g., vapor) phase. For example, aluminum chloride sublimates to the gas (e.g., vapor) phase above about 178 degrees Celsius (e.g., above 180 degrees Celsius) at atmospheric pressure. Thus, if the buffer tank 300 maintains the gas mixture containing aluminum chloride at atmospheric pressure, then the gas mixture is maintained at a temperature of 180 degrees Celsius or higher. Alternatively, if the buffer tank 300 maintains the gas mixture containing aluminum chloride at above atmospheric pressure, then the temperature may be higher than 180 degrees Celsius. Conversely, if the buffer tank 300 maintains the gas mixture containing aluminum chloride at below atmospheric pressure, then the temperature may be lower than 180 degrees Celsius. For example, the temperature may be 100 degrees Celsius or higher at 1 torr pressure.

Precise control of the metal chloride gas concentration, temperature, and pressure within a buffer tank 300 may be provided employing various control mechanisms. For example, the concentration of the metal chloride gas within the gas storage volume 311 can be measured using a metal chloride gas concentration sensor 346. The metal chloride gas concentration sensor 346 is attached to the buffer tank 300, and is configured to measure the concentration of the metal chloride gas within the process source gas that is stored in the buffer tank 300.

An inlet of the carrier gas influx regulator 342 can be connected to a carrier gas supply 340, and an outlet of the carrier gas influx regulator 342 can be attached to the buffer tank 300. The carrier gas supply 340 may contain the same inert gas (such as nitrogen or argon) as the inert gas supply 40. The carrier gas influx regulator 342 controls the flow rate of a carrier gas into the buffer tank 300. In one embodiment, the process controller 700 can be configured to receive data from the metal chloride gas concentration sensor 346, and can be configured to control the concentration of the metal chloride gas within the process source gas (i.e., within the gas mixture) by adjusting the flow rate of the carrier gas through the carrier gas influx regulator 342. In other words, the ratio of the metal chloride gas to the carrier gas concentration in the buffer tank 300 can be controlled.

In one embodiment, the apparatus 1000 includes a temperature regulator 348. This regulator ensures the temperature within the buffer tank 300 remains constant, thereby contributing to the stable operation of the metal chloride gas generation process. The temperature regulator 348 may comprise a heater and/or a chiller as known in the art. The temperature regulator 348 may also comprise a temperature sensor, such as thermocouple, which measures a temperature inside the buffer tank 300, and sends the measured temperature to the process controller 700, which then activates and/or deactivates the heater and/or chiller to control the temperature inside the buffer tank 300.

The pressure of the process source gas stored in the buffer tank 300 can be measured with a pressure sensor 344 attached to the buffer tank 300. The process controller 700 can be configured to controls the operation of the in-situ metal chloride gas generator 100 by turning it on and off based on the data transmitted from the pressure sensor 344. Specifically, if the measured value for the pressure within the gas storage volume 311 is below a first setpoint, the process controller 700 can turn on the in-situ metal chloride gas generator 100; and if the measured value for the pressure within the gas storage volume 311 is above a second setpoint, the process controller 700 can turn off the in-situ metal chloride gas generator 100. The second setpoint can be higher than the first setpoint.

In one embodiment, the process controller 700 may control the pressure within the gas storage volume 311 by activating and deactivating, i.e., by turning on and turning off, the in-situ metal chloride gas generator 100. For example, the in-situ metal chloride gas generator 100 can be activated by turning on at least one mass flow controller (32, 42) that controls supply of the chlorine-containing source gas and by activating a plasma 119 within the in-situ metal chloride gas generator 100. The in-situ metal chloride gas generator 100 can be deactivated by extinguishing the plasma 119 and by turning off the at least one mass flow controller (32, 42) that controls supply of the chlorine-containing source gas.

To ensure the overall safety and reliability of the system, the buffer tank 300 may be provided with a safety mechanism. For example, the buffer tank 300 may be provided with an overpressure relief valve 398 and a vent manifold 399 that is connected to a scrubber (not shown). The overpressure relief valve 398 allows for the controlled release of the process source gas in case of over-pressurization, thereby preventing potential system failures and ensuring safe operation.

The process unit 500 comprises a vacuum enclosure 510 that defines an enclosed volume 511 therein. The process unit 500 is configured to hold a substrate 8 therein. For example, the process unit 500 may comprise a chuck 520 configured to support the substrate 8. While a single-wafer processing tool is illustrated as an example of the process unit 500, it should be recognized that the process unit 500 may comprise any processing tool known in the art which can utilize the process source gas within the gas storage volume 311 of the buffer tank 300. For example, the process unit 500 may comprise an etching or deposition (e.g., ALD) apparatus capable of processing multiple substrates 8 at a time, or may comprise a cluster tool including multiple chambers.

Generally, the process unit 500 is also provided with a vacuum-tight sealable door 501 for passing the substrate 8 during a loading process and an unloading process. The process unit 500 receives a supply of the process source gas containing the molecules of the metal chloride gas from the buffer tank 300, provides the process source gas into the vacuum enclosure 510, and performs a material etching or deposition process that etches a layer on the substrate using the metal chloride gas or deposits a material including atoms of a metal element contained within the molecules of the metal chloride gas. For example, the process unit 500 may comprise an ALD tool in which a metal oxide layer, such as an aluminum oxide layer, is deposited on the substrate 8 by alternating supply of the process source gas and an oxidant, such as oxygen or water vapor. In one embodiment, the process unit 500 may comprise a process source gas mass flow controller 532 located on a second gas flow conduit (e.g., manifold or pipe) 530 and configured provide a controlled flow of the process source gas from the buffer tank 300 into the enclosed volume 511 of the process unit 500 through the second gas flow conduit 530.

Additional process gases may be provided to the process unit 500. For example, process gas sources (10, 20) can be connected to the process unit 500 through mass flow controllers (12, 22). A vacuum pump 590 may be connected to the enclosed volume 511. Optionally, a radio-frequency power supply 580 may be provided in the process unit 500 in case plasma is employed to induce deposition of a material within the process unit 500 (e.g., if the process unit comprises a plasma enhanced ALD tool).

In one embodiment, the apparatus 1000 may monitor and control the generation of the metal chloride gas in real time by monitoring the impedance of the plasma 119 during the metal chloride gas generation process. In this embodiment, abnormalities can be promptly detected, allowing for adjustments to be made to the process parameters. This monitoring capability ensures that the metal chloride gas generation process remains stable and efficient, further enhancing the reliability of the metal chloride gas supply.

Figure 2:
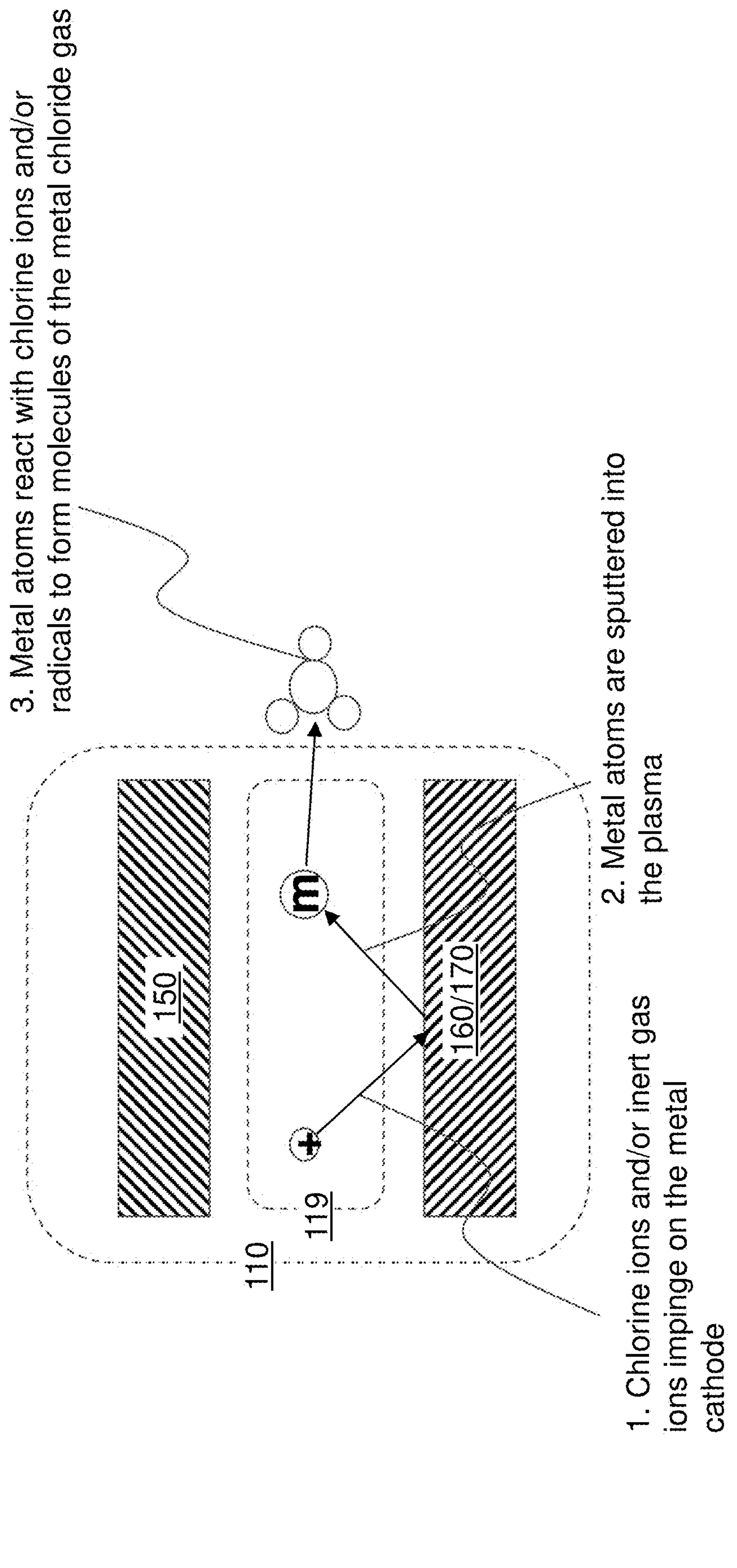
FIG. 2 is a schematic diagram of a direct plasma in-situ metal chloride gas generator according to an embodiment of the present disclosure.

Generally, the plasma 119 employed within the in-situ metal chloride gas generator 100 may comprise a direct plasma or a remote plasma. Referring to FIG. 2, a schematic diagram of a direct plasma in-situ metal chloride gas generator 100 is illustrated. This configuration involves a reaction where metal atoms are sputtered from the metal source 170 and then react with chlorine ions or radicals to form molecules of the metal chloride gas. In this embodiment the metal source 180 comprises a solid metal sputtering target. The chlorine-containing source gas comprises a mixture of the chlorine gas and the inert gas (such as an argon gas), controlled by mass flow controllers for precise flow rates. Chlorine and/or argon ions sputter the metal atoms (e.g., aluminum atoms) from the target metal source (i.e., a metal sputtering target) 170 which also functions as the cathode 160. A chemical reaction occurs between chlorine ions or radicals and the sputtered metal ions, to generate the molecules of the metal chloride gas (e.g., aluminum chloride gas).

In a direct plasma reaction scheme illustrated in FIG. 2, a reaction such as $M+Cl_x \rightarrow MCl_x$ is utilized. Here, metal atoms are sputtered and react with chlorine ions or radicals to form $MCl_x$. The value of x depends on the species of M, and may be in a range from 2 to 6. For example, if metal is aluminum, then x is 3. This method leverages plasma 119 to generate the reactive species required for the formation of metal chloride gas directly from the target metal source 170 (which is the cathode 160 in this embodiment).

Direct plasma systems use a plasma to directly interact with the target material. The plasma in this embodiment may be a direct current (DC) plasma, which is created by applying a DC current to one of the electrodes to generate an electrical discharge between two electrodes. This discharge ionizes the gas (e.g., argon mixed with chlorine), forming a plasma. In this embodiment, the target metal source 170 comprises the sputtering target which acts as the cathode 160 which is electrically connected to the radio-frequency power supply 180. The sputtering of metal atoms and their subsequent reaction with chlorine ions or radicals occur directly within the plasma region and/or downstream of the plasma region.

Figure 3:
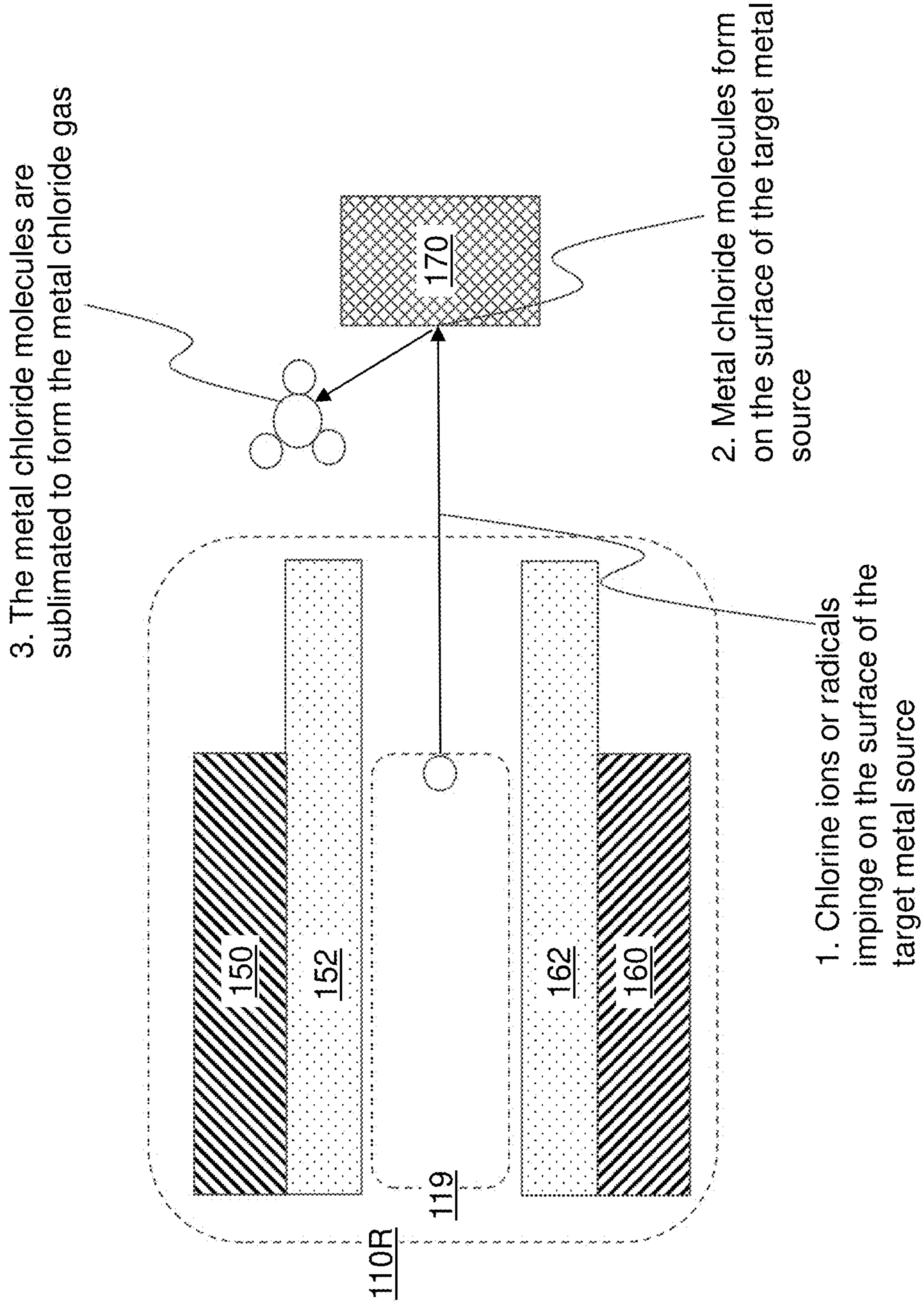
FIG. 3 is a schematic diagram of a remote plasma in-situ metal chloride gas generator according to an embodiment of the present disclosure.

Referring to FIG. 3, a plasma region of the in-situ metal chloride gas generator 100 is illustrated in case a remote plasma 119 is employed. In this setup, chlorine ions and/or radicals are produced in a remote plasma chamber 110R, and the target metal source 170 is located downstream of the plasma 119 in the remote plasma chamber 110R. In one embodiment, insulating spacers (152, 162) may be provided between the plasma 119 and the anode 150 and the cathode 160. For example, an anode-side insulating spacer 152 may be provided between the plasma 119 and the anode 150, and a cathode-side insulating spacer 162 may be provided between the plasma 119 and the cathode 160. The insulating spacers may comprise an insulating metal oxide material, such as alumina. The remote plasma 119 configuration allows for the separation of plasma generation and metal reaction zones, enhancing control and efficiency of metal chloride gas production and reducing contamination. The in-situ metal chloride gas generator 100 generates the molecules of the metal chloride gas through the reaction between chlorine-containing ions and/or radicals from the plasma 119 and a surface portion of the target metal source 170.

Generally, remote plasma systems generate the remote plasma separately from the reaction zone. In this case, an alternating current RF (radio frequency) or microwave generator is used to create the plasma 119 in a chamber away from the metal surface of the target metal source 170. The reactive species, such as chlorine radicals, are generated in this remote plasma chamber and then transported to the reaction zone where they interact with the metal surface of the target metal source 170. This separation allows for better control over the plasma properties and reduces contamination of the generated metal chloride gas.

Figure 4A:
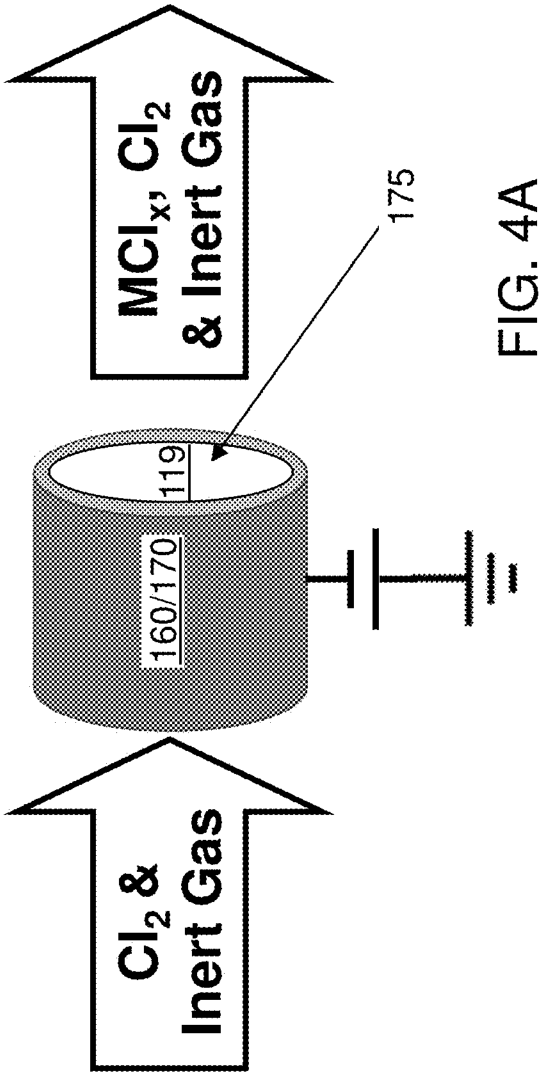
FIG. 4A is a schematic view of a first configuration of an in-situ metal chloride gas generator that employs a direct plasma in which a tubular cathode that functions as a target metal source according to an embodiment of the present disclosure. The tubular cathode is shown in a perspective view in FIG. 4A.
Figure 4B:
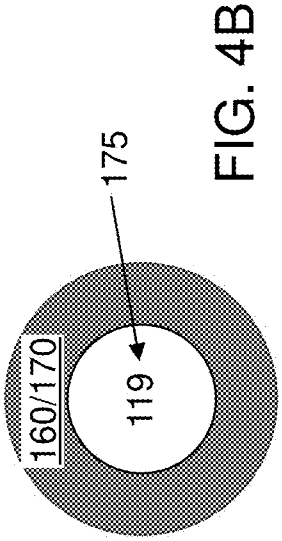
FIG. 4B is a vertical cross-sectional view of the first configuration of the in-situ metal chloride gas generator of FIG. 4A along a direction that is perpendicular to the gas flow direction.

Referring to FIGS. 4A and 4B, a first configuration of an in-situ metal chloride gas generator 100 is illustrated, which employs a direct current plasma 119 and a tubular electrode that functions as the cathode 160 and as the target metal source 170. The tubular electrode (160, 170) contains a cylindrical cavity 175 therein, and is configured to generate the plasma 119 of the chlorine-containing source gas within a volume of the cylindrical cavity 175. Thus, the direct current plasma 119 is generated within a cylindrical plasma zone. The tubular electrode (160, 170) is exposed to the plasma 119 while the plasma 119 is turned on.

Figure 5A:
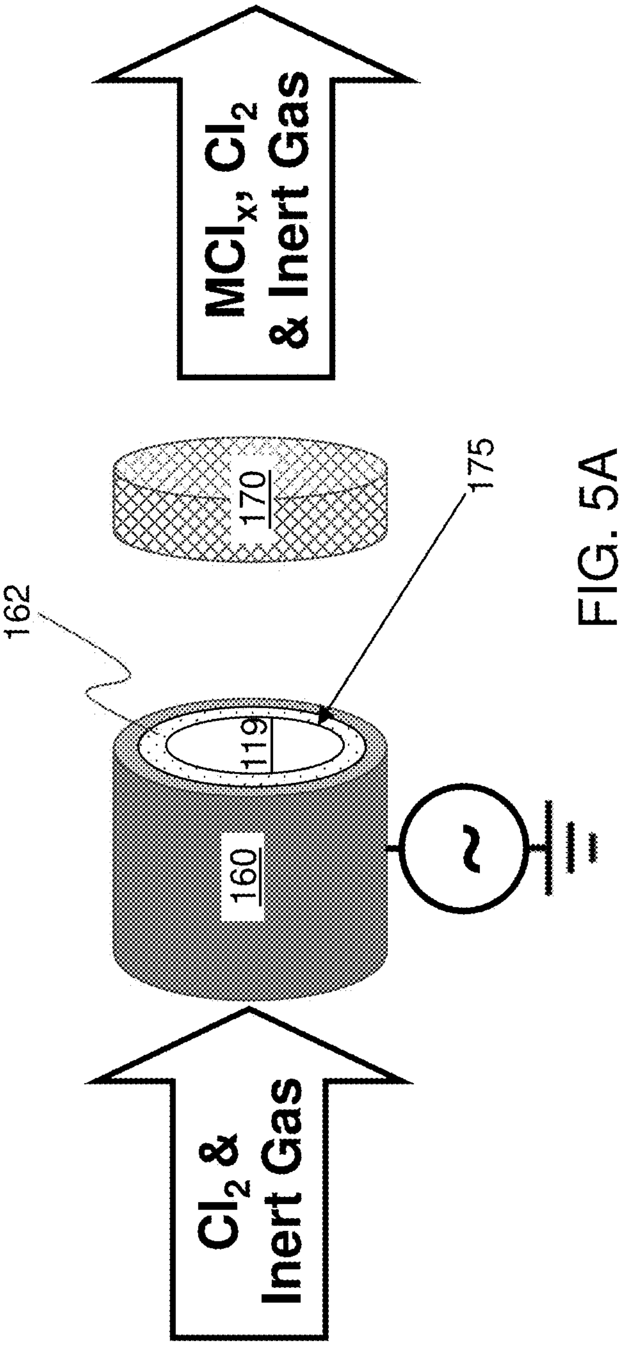
FIG. 5A is a schematic view of a second configuration of an in-situ metal chloride gas generator that employs a remote plasma according to an embodiment of the present disclosure. The tubular cathode is shown in a perspective view in FIG. 5A.
Figure 5B:
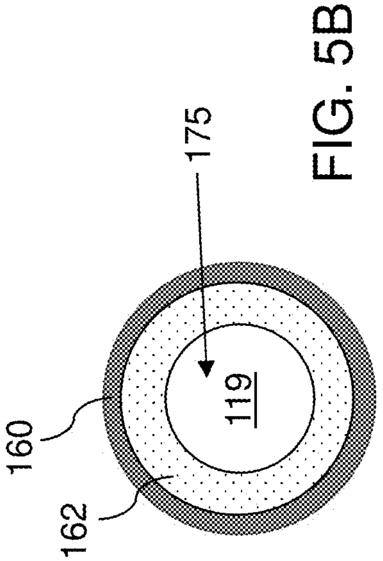
FIG. 5B is a vertical cross-sectional view of the second configuration of the in-situ metal chloride gas generator of FIG. 5A along a direction that is perpendicular to the gas flow direction.

Referring to FIGS. 5A and 5B, a second configuration employs a tubular cathode 160 and a remote plasma 119. The remote plasma 119 is generated with a cylindrical zone located within a volume of a cylindrical cavity 175 contained within the tubular cathode 160. The tubular cathode 160 can be spaced from the remote plasma by a tubular insulating spacer 162, which may be a tubular insulating spacer. The tubular insulating spacer 162 is located within the tubular electrode (i.e., the tubular cathode 160), and is configured to be exposed to the plasma 119 while the plasma 119 is turned on. The target metal source 170 is located downstream of the cylindrical plasma 119. Chlorine ions and/or radicals produced in the remote plasma 119 react with metal at the surface of the target metal source 170 to form $MCl_x$ molecules, which are then sublimated.

Figure 6:
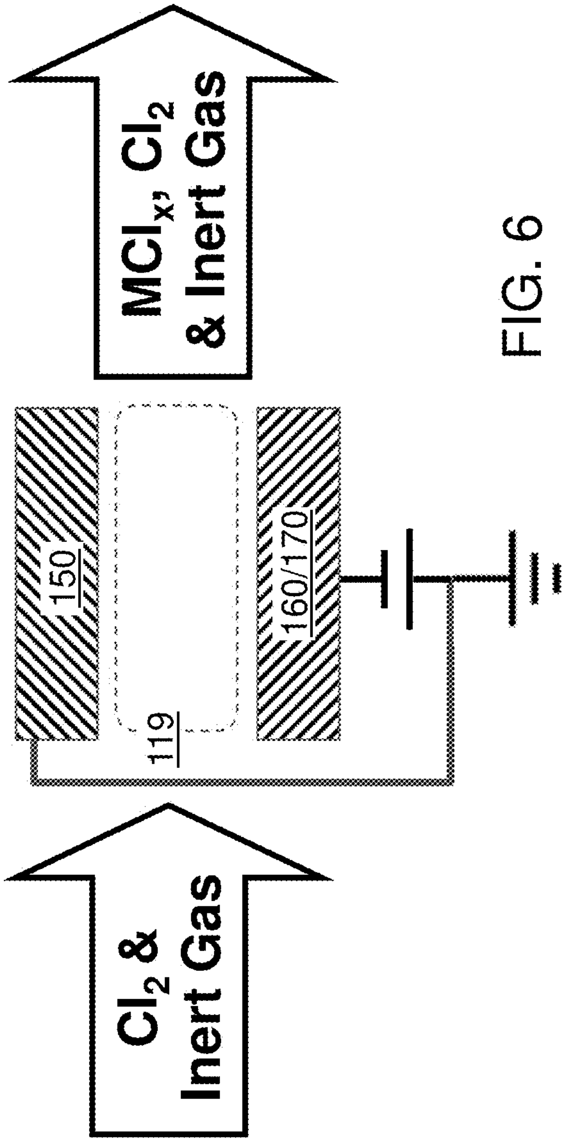
FIG. 6 is a schematic view of a third configuration of an in-situ metal chloride gas generator that employs a direct plasma including parallel plates according to an embodiment of the present disclosure.

Referring to FIG. 6, a third configuration of a plasma generation system employing a parallel plate plasma source is shown. The anode 150 and the cathode 160 may be formed as a pair of parallel plate electrodes. The plasma 119 can be generated within a volume located between the pair of parallel plates. The volume has a uniform width that is perpendicular to a direction of flow of the chlorine-containing source gas through the volume. The plasma 119 is formed between the anode 150 and the cathode 160. A direct current voltage or a radio frequency voltage may be applied between the anode 150 and the cathode 160. The cathode 160 functions as the target metal source 170. The exposed metal surfaces of the target metal source 170 provide the source metal to react with the chlorine ions and/or radicals from the plasma 119.

Figure 7:
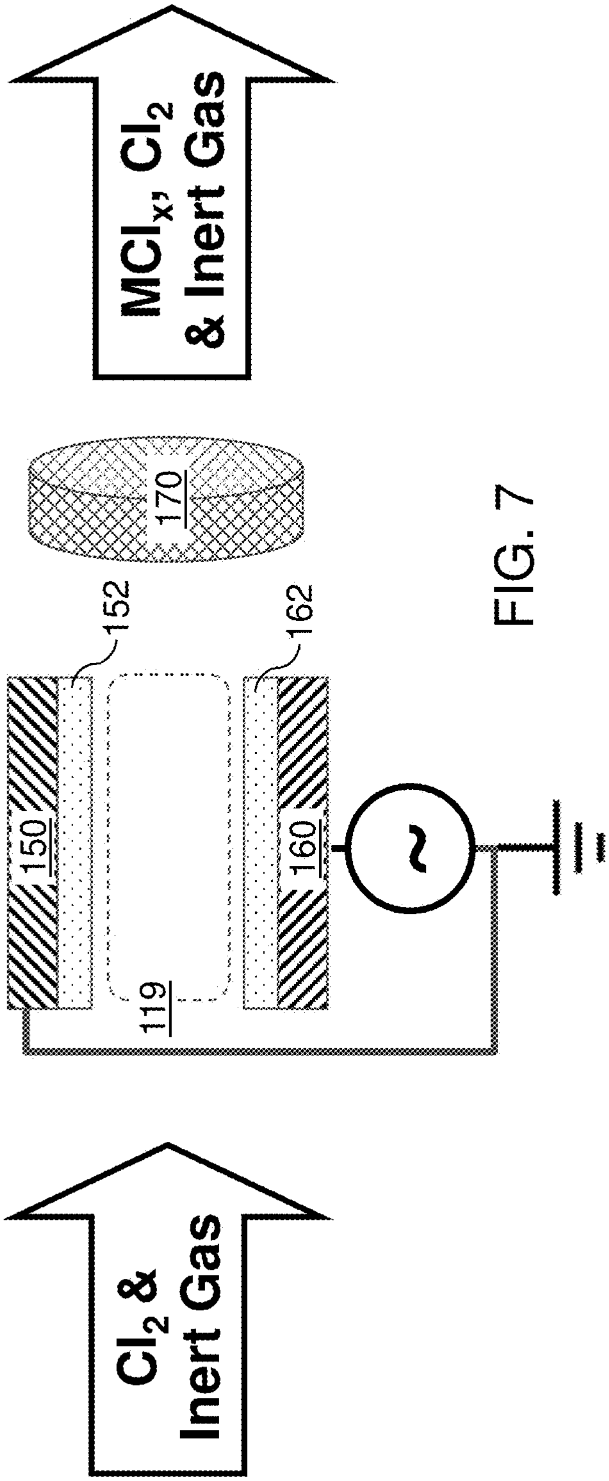
FIG. 7 is a schematic view of a fourth configuration of an in-situ metal chloride gas generator that employs a remote plasma according to an embodiment of the present disclosure.

Referring to FIG. 7, a fourth configuration with a remote plasma 119 and parallel plates is illustrated. The anode 150 and the cathode 160 may be formed as a pair of parallel plate electrodes. The plasma 119 can be generated within a volume located between the pair of parallel plates. The volume has a uniform width that is perpendicular to a direction of flow of the chlorine-containing source gas through the volume. The anode 150 and the cathode 160 are provided upstream, and the target metal source 170 is provided downstream. Insulating spacers (152, 162) can be interposed between the electrodes (150, 160) and the plasma 119. Chlorine ions and/or radicals from the plasma 119 impinge on the target metal source 170 located downstream, and react with the metal in the target metal source 170, thereby forming the metal chloride gas molecules.

Referring collectively to FIG. 1-7, by using the in-situ metal chloride gas generator 100 and the buffer tank 300, the apparatus 1000 provides consistent deliver of a process source gas including a metal chloride gases over time, and allows the etching or deposition of a wide range of materials in the process unit 500.

In one embodiment, the process unit 500 comprises an ALD tool configured to deposit a metal oxide layer, such as an aluminum oxide ($Al_2O_3$) layer, on the substrate 8. Aluminum chloride gas ($AlCl_3$) is alternately pulsed into the ALD tool deposition chamber to deposit at least one monolayer of aluminum atoms on the substrate. The aluminum atoms are then oxidized by pulsing an oxidant gas, such as oxygen or water vapor, into the deposition chamber to oxidize the aluminum atoms and to form at least one monolayer of aluminum oxide. This pulse sequence is repeated plural times to form an aluminum oxide layer on the substrate 8. The aluminum oxide layer can serve various purposes, such as an insulating layer in electronic devices, a protective coating against corrosion and wear, or as a component in optical devices due to its transparency and refractive properties.

In on embodiment, the target metal source 170 consists essentially of aluminum; and the metal chloride gas comprises aluminum chloride. In one embodiment, the process unit 500 comprises an oxidant mass flow controller connected to a supply of oxidizer gas and configured to provide a controlled flow of the oxidizer gas into the deposition chamber of the ALD tool. In this case, the process controller 700 can be configured to perform an aluminum oxide deposition process by alternately flowing the metal chloride gas and the oxidizer gas into the enclosed volume 511 of the ALD tool.

Various materials may be deposited employing the in-situ metal chloride gas generator 100. Such materials include metal oxides, such as aluminum oxide, titanium dioxide, tantalum oxide, copper oxide, hafnium oxide, zirconium oxide, vanadium oxide, etc.

According to various embodiments of the present disclosure, an apparatus 1000 is provided, which comprises: an in-situ metal chloride gas generator 100 comprising a radio-frequency power supply 180 configured to generate a plasma 119 of the chlorine-containing source gas, a target metal source 170 that is exposed to, or is located downstream of, the plasma 119, and a gas generator outlet 199 configured to collect molecules of a metal chloride gas that are generated at the target metal source 170 through reaction of the chlorine radicals and a surface portion of the target metal source 170; and a process unit 500 comprising a vacuum enclosure 510 configured to hold a substrate 8 therein, to receive a supply of a process source gas containing the molecules of the metal chloride gas, to provide the process source gas into the vacuum enclosure 510, and to perform a material deposition process that deposits a material including atoms of a metal element contained within the molecules of the metal chloride gas.

According to another aspect of the present disclosure, a method of operating an apparatus 1000 is provided. The method comprises: providing the apparatus 1000, wherein the apparatus 1000 comprises an in-situ metal chloride gas generator 100 comprising a radio-frequency power supply 180 configured to generate a plasma 119 of the chlorine-containing source gas, a target metal source 170 that is exposed to, or is located downstream of, the plasma 119, and a gas generator outlet 199 configured to collect molecules of a metal chloride gas that are generated at the target metal source 170 through reaction of the chlorine radicals and a surface portion of the target metal source 170, and the apparatus 1000 further comprises a process unit 500 comprising a vacuum enclosure 510, to receive a supply of a process source gas containing the molecules of the metal chloride gas and to provide the process source gas into the vacuum enclosure 510; loading a substrate 8 into the vacuum enclosure 510 of the process unit 500; generating the metal chloride gas employing the in-situ metal chloride gas generator 100; and performing a material deposition process that deposits a material including atoms of a metal element contained within the molecules of the metal chloride gas on the substrate 8.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph or in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent, provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A method, comprising:

generating a metal halide gas in a metal halide gas generator by generating a plasma of a halogen-containing source gas, and reacting halogen ions or radicals from the plasma with a solid target metal source configured as a solid phase metal plate or tube having a uniform thickness throughout to generate the metal halide gas, wherein the solid target metal source maintains a substantially constant exposed surface area as the metal halide gas is generated;

providing the metal halide gas from the metal halide gas generator to a buffer tank through a first gas flow conduit;

storing the metal halide gas in the buffer tank; and providing the metal halide gas from the buffer tank to a process unit through a second gas flow conduit to etch a material located on a substrate in the process unit or to deposit a material layer on a substrate located in the process unit.

2. A metal halide gas generation method, comprising:

generating a plasma of a halogen-containing source gas; and reacting halogen ions or radicals from the plasma with a solid target metal source configured as a solid phase metal plate or tube having a uniform thickness throughout to generate the metal halide gas, wherein the solid target metal source maintains a substantially constant exposed surface area as the metal halide gas is generated.

3. The method of claim 2, wherein the halogen-containing source gas comprises a mixture of halogen gas and an inert gas.

4. The method of claim 3, wherein the inert gas comprises argon, and the halogen gas comprises chlorine.

5. The method of claim 4, wherein the plasma is generated in a plasma chamber, and the halogen gas and the inert gas are provided to the plasma chamber through separate mass flow controllers to control a ratio of the halogen gas to the inert gas.

6. The method of claim 4, wherein:

the solid target metal source comprises an aluminum, tantalum, titanium, copper or vanadium solid target metal source; and the metal halide gas comprises $AlCl_3$, $TaCl_5$, $TiCl_4$, $CuCl_2$ or $VCl_4$.

7. The method of claim 6, wherein:

the solid target metal source comprises the aluminum solid target metal source; and the metal halide gas comprises the $AlCl_3$.

8. The method of claim 7, further comprising forming an aluminum oxide layer on a substrate by atomic layer deposition by alternately providing the $AlCl_3$ gas and an oxidizer gas into a vacuum enclosure of an atomic layer deposition tool in which the substrate is located.

9. The method of claim 2, further comprising:

providing the metal halide gas to a buffer tank;

storing the metal halide gas in the buffer tank; and providing the metal halide gas from the buffer tank to a process unit to etch a material located on a substrate in the process unit or to deposit a material layer on a substrate located in the process unit.

10. The method of claim 9, wherein the process unit comprises an atomic layer deposition tool, and the metal halide gas and an oxidizer gas are alternately provided into a vacuum enclosure of the atomic layer deposition tool to deposit the material layer comprising a metal oxide on the substrate by atomic layer deposition.

11. The method of claim 9, further comprising providing an inert carrier gas to the buffer tank separately from the metal halide gas, wherein the metal halide gas provided from the buffer tank to the process unit is mixed with the inert carrier gas.

12. The method of claim 4, wherein the solid target metal source comprises a sputtering target.

13. The method of claim 12, wherein:

the sputtering target comprises an electrode of a direct current power supply used to generate the plasma;

the plasma comprises ions or radicals of the halogen gas and ions of the inert gas;

the ions of the inert gas sputter metal atoms from the sputtering target; and the sputtered metal atoms react with the ions or radicals of the halogen gas to form the metal halide gas.

14. The method of claim 12, wherein the sputtering target comprises a planar sputtering target and the plasma is generated over a planar surface of the planar sputtering target.

15. The method of claim 12, wherein the sputtering target comprises a hollow cylindrical sputtering target comprising a cylindrical cavity therein, and the plasma is generated inside the cylindrical cavity.

16. The method of claim 4, wherein:

the plasma of the halogen-containing source gas is generated in an alternating current powered plasma chamber;

the solid target metal source is located downstream from the plasma chamber;

the plasma comprises ions or radicals of the halogen gas which are provided downstream from the plasma chamber to a surface of the solid target metal source to form metal halide molecules; and the metal halide molecules are sublimated to form the metal halide gas.

17. The method of claim 5, wherein the cathode electrode comprises a hollow cylindrical electrode comprising a cylindrical cavity therein and connected to an alternating current power source, the at least one insulating spacer is located in the cylindrical cavity, and the plasma is generated inside the cylindrical cavity.

18. The method of claim 16, wherein the plasma chamber comprises an anode electrode, a cathode electrode, and at least one insulating spacer between the cathode electrode and the plasma.

19. The method of claim 18, wherein the anode electrode and the cathode electrode comprise parallel plate electrodes connected to a direct current power source.

* * * * *